United States Patent [19]
Monroe et al.

[11] Patent Number: 5,098,803
[45] Date of Patent: Mar. 24, 1992

[54] PHOTOPOLYMERIZABLE COMPOSITIONS AND ELEMENTS FOR REFRACTIVE INDEX IMAGING

[75] Inventors: Bruce M. Monroe, Wilmington; William K. Smothers, Hockessin, both of Del.

[73] Assignee: E. I. Du Pont de Nemours and Company, Wilmington, Del.

[21] Appl. No.: 480,352

[22] Filed: Feb. 14, 1990

Related U.S. Application Data

[62] Division of Ser. No. 144,355, Jan. 15, 1988, Pat. No. 4,942,112.

[51] Int. Cl.$^5$ ............................................. G02B 5/32
[52] U.S. Cl. ................................. 430/1; 430/2; 430/13; 430/18; 430/281; 430/909; 430/912; 430/911; 430/910; 359/3

[58] Field of Search .................. 430/1, 2, 13, 18, 281, 430/909, 912, 911, 910; 350/3.61

[56] References Cited

U.S. PATENT DOCUMENTS

| | | | |
|---|---|---|---|
| 3,999,834 | 12/1976 | Ohtomo et al. | 522/144 X |
| 4,610,746 | 9/1986 | Broer et al. | 522/97 X |
| 4,942,102 | 7/1990 | Keys et al. | 430/1 |

*Primary Examiner*—Cynthia Hamilton

[57] ABSTRACT

Solid photopolymerizable compositions and photosensitive elements are provided that are useful in preparing optical elements, and especially holograms. The compositions contains a polymeric binder, a liquid ethylenically unsaturated monomer, and a photoinitiator system. Typical compositions have a refractive index modulation of at least 0.005 when measured per the specified test.

15 Claims, 1 Drawing Sheet

PHOTOPOLYMERIZABLE COMPOSITIONS AND ELEMENTS FOR REFRACTIVE INDEX IMAGING

RELATED APPLICATIONS

This application is a division of application Ser. No. 07/144,355, filed Jan. 15, 1988, is now issued as U.S. Pat. No. 4,942,112.

FIELD OF THE INVENTION

This invention relates to solid imaging compositions and elements which, after exposure, contain image areas having an index of refraction which is different from that of non-image areas. More particularly this invention relates to such systems wherein the refractive index image is a hologram.

DISCUSSION OF THE BACKGROUND AND PRIOR ART

The term "image recording" is conventionally taken to mean a process which produces a spatial pattern of optical absorption in the recording medium. Photographic processes are well known examples of this type of process.

In a broader sense, however, the word "image" means a spatial variation of the optical properties of a sample in such a way as to cause a desired modification of a beam of light passing through the sample. Refractive index images in general, and holograms in particular, which modulate the phase, rather than the amplitude of the beam passing through them, are usually referred to as phase holograms. Phase holographic image recording systems produce a spatial pattern of varying refractive index rather than optical absorption in the recording medium and, thus, can modulate a beam of light without absorbing it.

This type of refractive index image also includes a number of optical elements or devices which superficially bear little resemblance to absorption images. Examples are holographic lenses, gratings, mirrors, and optical waveguides.

Holography is a form of optical information storage. The general principles are described in a number of references, e.g., "Photography by Laser" by E. N. Leith and J. Upatnieks in SCIENTIFIC AMERICAN, 212, No. 6, 24–35 (June, 1965). In brief, the object to be photographed or imaged is illuminated with coherent light, e.g., from a laser, and a light sensitive recording medium, e.g., a photographic plate, is positioned so as to receive light reflected from the object. Each point on the object reflects light to the entire recording medium, and each point on the medium receives light from the entire object. This beam of reflected light is known as the object beam. At the same time, a portion of the coherent light is beamed by a mirror directly to the medium, bypassing the object. This beam is known as the reference beam. What is recorded on the recording medium is the interference pattern that results from the interaction of the reference beam and the object beam impinging on the medium. When the processed recording medium is subsequently illuminated and observed appropriately, the light from the illuminating source is diffracted by the hologram to reproduce the wave-front that originally reached the medium from the object, so that the hologram resembles a window through which the virtual image of the object is observed in full three-dimensional form, complete with parallax.

Holograms that are formed by allowing the reference and object beams to enter the recording medium from the same side are known as transmission holograms. Interaction of the object and reference beams in the recording medium forms fringes of material with varying refractive indices which are normal or near normal to the plane of the recording medium. When the hologram is played back by viewing with transmitted light, these fringes refract the light to produce the viewed virtual image. Such transmission holograms may be produced by methods which are well known in the art such as disclosed in U.S. Pat. No. 3,506,327; U.S. Pat. No. 3,838,903 and U.S. Pat. No. 3,894,787 each of which is incorporated herein by reference.

Holograms formed by allowing the reference and object beams to enter the recording medium from opposite sides, so that they are traveling in approximately opposite directions are known as reflection holograms. Interaction of the object and reference beams in the recording medium forms fringes of material with varying refractive indices which are, approximately, planes parallel to the plane of the recording medium. When the hologram is played back these fringes act as mirrors reflecting incident light back to the viewer. Hence, the hologram is viewed in reflection rather than in transmission. Since the wavelength sensitivity of this type of hologram is very high, white light may be used for reconstruction. Reflection holograms produced by an off-axis process are disclosed in U.S. Pat. No. 3,532,406 which is incorporated herein by reference.

A diffraction grating is the simplest possible transmission hologram. It is the hologram of two coherent plane waves. It can be created by splitting a single laser beam and recombining the beams at the recording medium.

The interference pattern produced by two plane waves which are coherent and are not polarized perpendicular to each other is a set of uniformly spaced fringes with a sinusoidal intensity distribution. When incident on a recording medium they produce a set of uniformly spaced fringes which have a sinusoidal variation in refractive index, generally referred to as a grating, oriented parallel to the bisector of the angle between the two beams. If the two waves are incident at equal angles with respect to the surface of the recording medium and are both incident on the same side of the recording medium, the fringes are perpendicular to the surface of the medium and the grating is said to be unslanted. The hologram grating produced is said to be a transmission grating since light passing through it is diffracted. The grating is said to be thick if it is much thicker than the distance between the fringes, generally referred to as the grating spacing.

A diffraction grating can be characterized by its diffraction efficiency, that is the percent of incident radiation which is diffracted, and by its thickness. A simple but useful theory for thick hologram gratings, generally known as the "coupled wave theory", has been developed by Kogelnik (H. Kogelnik, Coupled wave theory for thick hologram gratings, *Bell Syt. Tech. J.*, 48, 2909–2947, 1969). This theory treats the relationship between diffraction efficiency, grating thickness, wavelength of incident radiation, and the angle of incident radiation. A useful discussion of this theory in regard to refractive index recording systems has been presented in Section II of an article by Tomlinson and Chandross (W. J. Tomlinson and E. A. Chandross, Organic photochemical refractive-index image recording systems, *Adv. in Photochem.*, Vol. 12, J. N. Pitts, Jr., G. S. Hammond, and K. Gollinick, eds., Wiley-Interscience, New York, 1980, pp 201–281).

Refractive index modulation is a quantitative measure of the change in refractive index between image and non-image portions of a hologram or other recording medium containing a refractive index image. For the diffraction grating, refractive index modulation is the measure of the amplitude of the sinusoidal modulation of the refractive index within the recording medium produced when the holographic image is recorded. The refractive index modulation, or index modulation, for a recording medium is best determined by holographically forming a grating in the medium and calculating the index modulation using Kogelnik's coupled wave theory and the measured parameters of the grating formed, i.e., the diffraction efficiently, medium thickness, etc.

A variety of materials have been used to record volume holograms. Among the more important are: silver halide emulsions, hardened dichromated gelatin, ferroelectric crystals, photopolymers, photochromics and photodichroics. Characteristics of these materials are given in *Volume Holography and Volume Gratings*, Academic Press, New York, 1981 Chapter 10, pp. 254–304 by L. Solymar and D. J. Cook.

Dichromated gelatin is the material most widely used for recording volume holograms. This material has become the popular choice because of its high diffraction efficiency and low noise characteristics. However, the material has poor shelf life and requires wet processing. Plates must be freshly prepared, or prehardened gelatin must be used. Wet processing means that an additional step is required in hologram preparation and may also cause the hologram to change due to swelling and then shrinkage of the gelatin during processing. The requirement that plates by freshly prepared each time a hologram is made, plus the problems associated with wet processing, make reproducibly extremely difficult to achieve with dichromated gelatin.

While early holograms were prepared from silver halide, liquid photopolymers, or dichromated colloids which required several processing steps, solid photopolymerizable elements have been proposed that require only a single process step. U.S. Pat. No. 3,658,526, to Haugh, discloses preparation of stable high-resolution holograms from solid photopolymerizable layers by a single step-process wherein a permanent refractive index image is obtained by a single imagewise exposure of the photopolymerizable layer to actinic radiation bearing holographic information. The holographic image formed is not destroyed by subsequent uniform actinic exposure, but rather is fixed or enhanced.

Although the solid photopolymerizable layers proposed by Haugh offer many advantages over the prior art, their efficiency is low. These layers typically have a refractive index of modulation in the range of 0.001 to 0.003. As a result, reconstructed holographic images formed in thin layers of the photopolymer only have limited brightness. While brightness can be increased by employing thicker layers of the photopolymer, this solution results in a substantial reduction to the viewing angle and causes the manufacturer to use much more of the expensive photopolymer. It also should be noted that the coated layers proposed by Haugh generally cannot be stored at room temperature for extended times without loss of speed and diffraction efficiency. Thus, there continues to be a need for improved photopolymer compositions and elements for refractive index imaging applications, including holography.

SUMMARY OF THE INVENTION

This invention provides storage stable, solid, photopolymerizable compositions and photosensitive elements that have improved response to actinic radiation and produce holograms of improved brightness. More particularly, in one embodiment this invention provides a substantially solid, photopolymerizable composition that forms a refractive-index image upon exposure to actinic radiation as the sole processing step, said composition consisting essentially of:

(a) 25 to 75% of a solvent soluble, thermoplastic polymeric binder;
(b) 5 to 60% of a liquid ethylenically unsaturated monomer, said monomer having a boiling point above 100° C. and being capable of addition polymerization;
(c) 0.1 to 10% of a photoinitiator system that activates polymerization of said unsaturated monomer upon exposure to actinic radiation;

wherein said percentages are weight percentages of the total binder, unsaturated monomer and photoinitiator system of components (a), (b), and (c), the composition having a refractive index modulation of at least 0.005 as determined with 632.8 nm radiation from a transmission grating having a spatial frequency of 1000 lines per millimeter, which transmission grating is prepared holographically from a layer of said composition.

The refractive index modulation for compositions of this invention is calculated, using Kogelnik's coupled wave theory, from diffraction efficiency measured with 632.8 nm radiation and layer thickness of a holographically formed grating in the layer of each composition, wherein the grating has a spatial frequency of about 1000 lines per mm, i.e., between 900 and 1100 lines per mm. Using this method and the constant conditions as defined hereinunder, index modulations for materials of this invention are differentiated from those of the prior art.

In a preferred embodiment of this invention, components (a) and (b) are selected so that either the polymeric material (a) or the liquid monomer (b) contains a substituent from the group consisting of phenyl, phenoxy, naphthyl, naphthyloxy, heteroaromatic containing up to three aromatic rings, chlorine, bromine atom, and mixtures thereof, and wherein the remaining component is substantially free of said groups or atoms.

In a further embodiment of this invention the solid, photopolymerizable composition contains as a fourth component (d) a liquid plasticizer taken from the group consisting of tris(2-ethylhexyl)phosphate, glyceryl tributyrate, and a compound having the general formula:

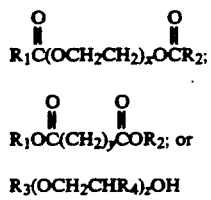

$R_1C(OCH_2CH_2)_xOCR_2$;

$R_1OC(CH_2)_yCOR_2$; or $R_3(OCH_2CHR_4)_zOH$ wherein $R_1$ and $R_2$ each is an alkyl group of 1 to 10 carbon atoms; x is 1–4; y is 2–10, $R_3$ is H or an alkyl group of 8 to 16 carbon atoms, $R_4$ is H or $CH_3$, and z is 1-20.

BRIEF DESCRIPTION OF THE DRAWING

The FIGURE illustrates the experimental arrangement used to holographically determine the refractive index modulation.

DETAILED DESCRIPTION OF THE INVENTION

Figure 1:
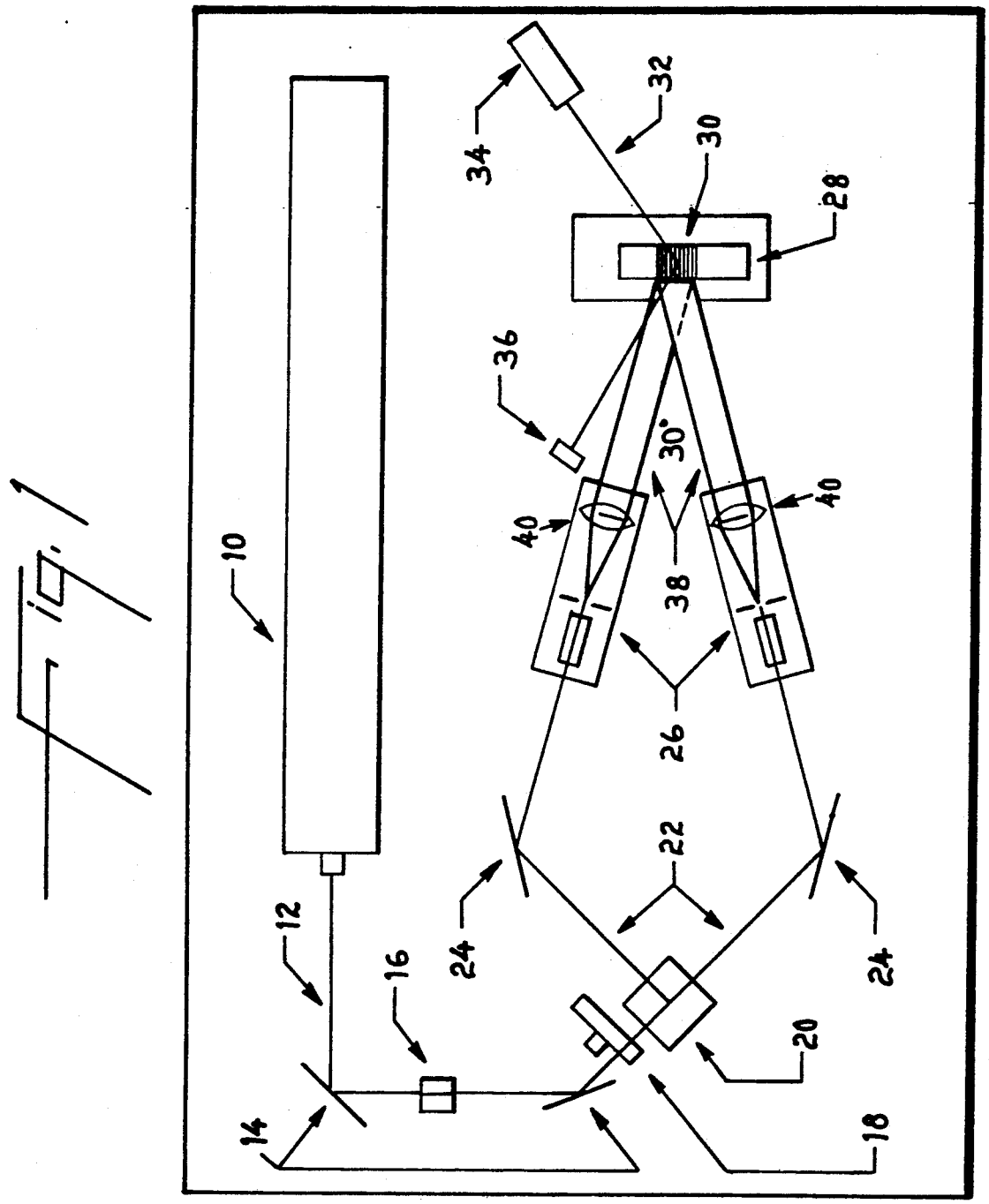

The improved photopolymerizable compositions of this invention are substantially solid and are typically used as a layer applied to a permanent substrate. The composition may be directly coated onto the substrate by any conventional method or may be laminated thereto as a storage stable preformed element comprising the photopolymerizable layer releasably adhered to a temporary support film such as polyethylene terephthalate.

The photopolymerizable layer is a thermoplastic composition which, upon exposure to actinic radiation, forms crosslinks or polymers of higher molecular weight to change the refractive index and rheological character of the composition. Preferred photopolymerizable compositions are compositions wherein free radical addition polymerization and crosslinking of a compound containing one or more ethylenically unsaturated groups, usually in a terminal position, harden and insolubilize the composition. The sensitivity of the photopolymerizable composition is enhanced by the photoinitiating system which may contain a component which sensitizes the composition to practical radiation sources, e.g., visible light.

Conventionally a binder is the most significant component of a substantially dry photopolymerizable film or layer in terms of what physical properties the film or laminate will have while being used in the invention. The binder serves as a containing medium for the monomer and photoinitiator prior to exposure, provides the base line refractive index, and, after exposure, contributes to the physical and refractive index characteristics needed for the refractive index image formed. Cohesion, adhesion, flexibility, miscibility, tensil strength, in addition to index of refraction, are some of the many properties which determine if the binder is suitable for use in a refractive index medium. In practicing this invention, dry film photopolymerizable elements of various types may be used, provided they contain a liquid monomer and the refractive index modulation criterion is met.

Elements of these types are prepared by conventionally coating the photopolymerizable composition on a wide variety of transparent substrates. By "substrate" is meant any natural or synthetic support, preferably one which is capable of existing in a flexible or rigid film or sheet form. For example, the substrate could be a sheet or film of synthetic organic resin, or a composite of two or more materials. Specific substrates include polyethylene terephthalate film, e.g., resin-subbed polyethylene terephthalate film, flame or electrostatic discharge treated polyethylene terephthalate film, glass, cellulose acetate film, and the like. The particular substrate will generally be determined by the application involved.

While the photopolymerizable layer is a solid sheet of uniform thickness, it is composed of three major components: (A) a solid, solvent soluble, preformed polymeric material; (B) at least one liquid ethylenically unsaturated monomer capable of addition polymerization to produce a polymeric material with a refractive index substantially different from that of the preformed polymeric material; and (C) a photoinitiator system activatable by actinic radiation. Although the layer is solid composition, components interdiffuse before, during and after imaging exposure until they are fixed or destroyed by a final uniform treatment, which usually is a further uniform exposure to actinic radiation. Interdiffusion may be further promoted by incorporation into the composition of an otherwise inactive plasticizer of this invention. In addition to the liquid monomer, the composition may contain solid monomer components capable of interdiffusing in the solid composition and reacting with the liquid monomer to form a copolymer with a refractive index shifted from that of the preformed polymeric material.

The refractive index shift resulting from imaging polymerization of the monomer of the composition is best measured as the refractive index modulation as calculated from the parameters of a grating formed holographically in a layer of the composition. This measurement is achieved using the 30° holographic grating system illustrated in the Figure. In the system an argon ion laser (10) operating at 488 nm and TEMoo produces a laser beam (12) which is directed by mirrors (14) and a beam elevator (16) through an attenuator (18) and into a beam splitter (20) wherein the beam is divided into two approximately equal beam segments (22). Each beam segment (22) is reflected by a mirror (24), through a spatial filter (26) and collimator (40) to converge in the plane of glass mounted sample (28) to subtend an angle of about 30° whose bisector is approximately normal to the plane of the sample (28) so as to form a grating hologram (30). Grating (30) formation is measured in real time by passing a 632.8 nm beam (32) from a He:Ne laser (34) through the center of the exposure area at the Bragg angle and the intensity of the laser beam (32) defracted by the sample (28) is monitored with a detector (36).

In the practice of this invention a film element is prepared comprising a flexible, transparent, polyethylene terephthalate support sheet having coated thereon a solid photopolymerizable layer about 10 to 60 μm thick which optionally is protected with a polypropylene, polyethylene, or polyethylene terephthalate cover sheet. A section of the film element is cut, the cover sheet removed, if present, and then mounted onto a 4×5 inch glass plate by hand laminating the uncovered layer surface to the glass surface. Even though the layer is solid, its surface typically is tacky and adheres readily to the glass surface. In those instances where tack is absent, heat and pressure may be used to laminate the photopolymerizable layer to the glass substrate surface. Typically the polyethylene terephthalate film support is left in place on the laminate and serves to protect the layer during handling and exposure operations.

The glass mounted photopolymerizable layer (28) is evaluated in the 30° holographic grating system described above wherein the emerging collimated beam (38) intensity ratio is maintained at approximately 1:1, with absolute intensities ranging from 3–10 mW/cm² per beam (38). The diameter of each emerging beam (38) is about 1 cm. The photopolymerizable layer (28) is exposed for 4–32 seconds to the modulated laser radiation at the convergence of beams (38) corresponding to 50–600 mJ/cm² total exposure. About one minute after this image-wise exposure the grating is reexposed for approximately 1–2 minutes using one of the two emerging beams (38) to fix or complete polymerization throughout the photopolymerizable layer (28). As described earlier, grating (30) formation is monitored using the non-actinic 632.8 nm beam (32) of a He:Ne laser (34) and a detector (36) which is a Coherent model 212 power meter attached to a strip chart recorder. Diffraction efficiency ($\eta$) is calculated as the ratio of the diffracted beam intensity ($I_{diff}$) to the pre-exposure undiffracted beam intensity ($I_o$) after passing through the coating:

$$\eta = I_{diff}/I_o \qquad (1)$$

Coating thickness is measured for the photocured sample using a conventional thickness measuring system.

The refractive index modulation in the recorded grating is calculated from the measured diffraction efficiency and coating thickness using Kogelnik's coupled wave theory, which for unslanted transmission diffraction gratings gives:

$$M = \frac{\lambda \cos\theta_o \sin^{-1}(\eta)^{\frac{1}{2}}}{\pi d} \qquad (2)$$

where:
M = refractive index modulation
$\lambda$ = probe radiation wavelength in free space (632.8 nm)
$\theta_o$ = angle within the recording medium between the probe radiation and a line perpendicular to the plane of the medium ($\theta_o = 12.93°$ for $\lambda = 632.8$ nm)
$\eta$ = diffraction efficiency of the grating
d = grating thickness.

The internal angle $\theta_o = 12.93°$ of the probe beam within the recording medium is calculated from the external angle $\theta = 15°$ between the line normal to the film plane and the 488 nm recording beams using Snell's law:

$$\sin \theta_o = n_o \sin \theta_o \qquad (3)$$

and Bragg's law:

$$2\Lambda \sin \theta_o = \lambda/n_o \qquad (4)$$

where $\Lambda$ is the fringe spacing and $n_o$ is the average refractive index of the medium. A value of 1.50 for $n_o$ is used in all calculations.

Holographic gratings prepared and measured using the specified procedure typically have a spatial frequency of about 1000 lines per mm, i.e., between 900 and 1100 lines per mm. For the purpose of this invention refractive index modulation is defined as the refractive index modulation as measured with 632.8 nm probe radiation from a transmission grating having a spatial frequency of about 1000 lines per mm as prepared by the specified procedure. This refractive index modulation is contrasted to refractive index modulations wherein the spatial frequency is substantially different, is measured with a different probe radiation, or wherein totally different measurement procedure is used, e.g., interference microscopy procedures.

The improved solid photopolymerizable compositions of this invention, which produced acceptably bright and sharp transmission holograms, have a refractive index modulation, M, which is at least about 0.005 as calculated using this procedure and system.

In the compositions of this invention, the preformed polymeric material and the liquid monomer are selected so that either the preformed polymeric material or the monomer contains one or more moieties taken from the group consisting of substituted or unsubstituted phenyl, phenoxy, naphthyl, naphthyloxy, and heteroaromatic groups containing up to three aromatic rings, chlorine, bromine, and wherein the remaining component is substantially free of the specified moieties. In the instance when the monomer contains these moieties, the photopolymerizable system hereinafter is identified as a "Monomer Oriented System", and when the polymeric material contains these moieties, the photopolymerizable system hereinafter is identified as a "Binder Oriented System".

The stable, solid, photopolymerizable compositions of this invention will be more fully described by reference to the "Monomer Oriented System" and "Binder Oriented System".

MONOMER ORIENTED SYSTEM

The monomer of the Monomer Oriented System is a liquid, ethylenically unsaturated compound capable of addition polymerization and having a boiling point above 100° C. The monomer contains a substituent from the group consisting of phenyl, phenoxy, naphthyl, naphthyloxy, heteroaromatic containing up to three aromatic rings, chlorine, and bromine. The monomer contains at least one such moiety and may contain two or more of the same or different moieties of the group, provided the monomer remains liquid. Contemplated as equivalent to the groups are substituted groups where the substitution may be lower alkyl, alkoxy, hydroxy, carboxy, carbonyl, amino, amido, imido or combinations thereof, provided the monomer remains liquid and diffusable in the photopolymerizable layer. Suitable Monomers which can be used as the sole monomer or in combination with liquid monomers of this type include, but are not limited to, styrene, 2-chlorostyrene, 2-bromostyrene, methoxystyrene, phenyl acrylate, p-chlorophenyl acrylate, 2-phenylethyl acrylate, 2-phenoxyethyl acrylate 2-phenoxyethyl methacrylate, phenol ethoxylate acrylate, 2-(p-chlorophenoxy)ethyl acrylate, benzyl acrylate, 2-(1-naphthyloxy)ethyl acrylate, 2,2-di(p-hydroxyphenyl)-propane diacrylate or dimethacrylate, 2,2-di-(p-hydroxyphenyl)-propane dimethacrylate, polyoxyethyl-2,2-di-(p-hydroxyphenyl)-propane dimethacrylate, di-(3-methacryloxy-2-hydroxypropyl) ether of bisphenol-A, di-(2-methacryloxyethyl) ether of bisphenol-A, ethoxylated bisphenol-A diacrylate, di(3-acryloxy-2-hydroxypropyl) ether of bisphenol-A, di(2-acryloxyethyl) ether of bisphenol-A, di(3-methacryloxy-2-hydroxypropyl) ether of tetrachloro-bisphenol-A, di-(2-methacryloxyethyl) ether of tetrachloro-bisphenol-A, di-(3-methacryloxy-2-hydroxypropyl) ether of tetrabromo-bisphenol-A, di-(2-methacryloxyethyl) ether of tetrabromo-bisphenol-A, di-(3-methacryloxy-2-hydroxypropyl) ether of diphenolic acid, 1,4-benzenediol dimethacrylate, 1,4-diisopropenyl benzene, 1,3,5-triisopropenyl benzene, hydroquinone monomethacrylate, and 2-[$\beta$-(N-carbazyl)propionyloxy]ethyl acrylate.

Particularly preferred liquid monomers for use in the Monomer Oriented System of this invention are 2-phenoxyethyl acrylate, 2-phenoxyethyl methacrylate, phenol ethoxylate acrylate, 2-(p-chlorophenoxy)ethyl acrylate, p-chlorophenyl acrylate, phenyl acrylate, 2-phenylethyl acrylate, di(2-acryloxyethyl) ether of bisphenol-A, ethoxylated bisphenol-A diacrylate, and 2-(1-naphthyloxy)ethyl acrylate.

While monomers useful in this invention are liquids, they may be used in admixture with a second solid monomer such as N-vinylcarbazole; ethylenically unsaturated carbazole monomers such as disclosed in *Journal of Polymer Science: Polymer Chemistry Edition*, Vol. 18, pages 9–18 (1979) by H. Kamogawa et al.; 2-naphthyl acrylate; pentachlorophenyl acrylate; 2,4,6-tribromophenyl acrylate, bisphenol A diacrylate; 2-(2-naphthyloxy)ethyl acrylate; and N-phenyl maleimide.

The solvent soluble polymeric material or binder of the Monomer Oriented System is substantially free of a substituent from the group consisting of phenyl, phenoxy, naphthyl, naphthyloxy, heteroaromatic containing up to three aromatic rings, chlorine, and bromine.

Suitable binders of this class, which are solvent soluble, thermoplastic polymers, can be used alone, or in combination with one another and include the following: acrylate and alpha-alkyl acrylate ester and acid polymers and interpolymers e.g., polymethyl methacrylate and polyethyl methacrylate; polyvinyl esters, e.g., polyvinyl acetate, polyvinyl acetate/acrylate, polyvinyl acetate/methacrylate and hydrolyzed polyvinyl acetate; ethylene/vinyl acetate copolymers; saturated and unsaturated polyurethanes; butadiene and isoprene polymers and copolymers and high molecular weight polyethylene oxides of polyglycols having average molecular weights from about 4,000 to 1,000,000; epoxides, e.g., epoxides containing acrylate or methacrylate groups; polyamides, e.g., N-methoxymethyl polyhexamethylene adipamide; cellulose esters, e.g., cellulose acetate, cellulose acetate succinate and cellulose acetate butyrate; cellulose ethers, e.g., methyl cellulose, and ethyl cellulose; polycarbonates; and polyvinyl acetals, e.g., polyvinyl butyral and polyvinyl formal. Acid containing polymers and copolymers functioning as suitable binder include those disclosed in U.S. Pat. No. 3,458,311 and in U.S. Pat. No. 4,273,857. As well as the amphoteric polymeric binders disclosed in U.S. Pat. No. 4,293,635, each of which is incorporated herein by reference.

Particularly preferred binders for use in the Monomer Oriented System of this invention are cellulose acetate butyrate polymers; acrylic polymers and inter polymers including polymethyl methacrylate, methyl methacrylate/methacrylic acid and methyl methacrylate/acrylic acid copolymers, terpolymers of methylmethacrylate/$C_2$–$C_4$ alkyl acrylate or methacrylate/acrylic or methacrylic acid; polyvinylacetate; polyvinyl acetal; polyvinyl butyral; polyvinyl formal; and as well as mixtures thereof.

BINDER ORIENTED SYSTEM

The monomer of the Binder Oriented System is a liquid, ethylenically unsaturated compound capable of addition polymerization and having a boiling point above 100° C. The monomer is substantially free of moieties taken from the group consisting of phenyl, phenoxy, naphthyl, naphthyloxy, heteroaromatic containing up to three aromatic rings, chlorine and bromine. Suitable monomers of this type which can be used as the sole monomer or in combination with other monomers include, but are not limited to, the following: t-butyl acrylate, cyclohexyl acrylate, iso-bornyl acrylate, 1,5-pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, pentaerythritol triacrylate, polyoxyethylated trimethylolpropane triacrylate and trimethacrylate and similar compounds as disclosed in U.S. Pat. No. 3,380,831, pentaerythritol tetraacrylate, triethylene glycol diacrylate, triethylene glycol dimethacrylate, polyoxypropyltrimethylol propane triacrylate (462), ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, pentaerythritol tetramethacrylate, trimethylolpropane trimethacrylate, 1,5-pentanediol dimethacrylate, diallyl fumarate, 1H,1H-perfluorooctyl acrylate, 1H,1H,2H,2H-perfluorooctyl methacrylate, and 1-vinyl-2-pyrrolidinone.

In addition to the ethylenically unsaturated monomers mentioned above, the photohardenable layer can also contain one or more free radical-initiated, chain-propagating, addition-polymerizable, ethylenically unsaturated compounds generally having a molecular weight of at least about 300. Preferred monomers of this type are an alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of addition polymerizable ethylenic linkages particularly when present as terminal linkages.

Particularly preferred liquid monomers for use in Binder Oriented Systems of this invention include decanediol diacrylate, iso-bornyl acrylate, triethylene glycol diacrylate, diethyleneglycol diacrylate, triethylene glycol dimethacrylate, ethoxyethoxyethyl acrylate, triacrylate ester of ethoxylated trimethylolpropane, and 1-vinyl-2-pyrrolidinone.

While monomers useful in Binder Oriented Systems are liquids, they may be used in admixture with a second solid monomer of the same type, e.g., N-vinylcaprolactam.

The solvent soluble, polymeric material or binder of the Binder Oriented System contains in its polymeric structure moieties taken from the group consisting of phenyl, phenoxy, naphthyl, naphthyloxy, heteroaromatic containing up to three aromatic rings, chlorine, bromine and mixtures thereof. Contemplated as equivalent to the groups are substituted groups where the substitution may be lower alkyl, alkoxy, hydroxy, carboxy, carbonyl, amido, imido or combinations thereof, provided the binder remains solvent soluble and thermoplastic. The moieties may form part of the monomeric units which constitute the polymeric binder or may be grafted onto a preprepared polymer or interpolymer. The binder of this type may be a homopolymer or it may be an interpolymer of two or more separate monomeric units wherein at least one of the monomeric units contains one of the moieties identified above.

Suitable binders of this class which are solvent soluble, thermoplastic polymers or interpolymers can be used alone, or in combination with one another, include the following: polystyrene polymers and copolymers, e.g., with acrylonitrile, maleic anhydride, acrylic acid, methacrylic acid and esters thereof; vinylidene chloride copolymers, e.g., vinylidene chloride/acrylonitrile; vinylidene chloride/methacrylate and vinylidene chloride/vinyl acetate copolymers; polyvinyl chloride and copolymers, e.g., polyvinyl chloride/acetate; polyvinyl benzal synthetic rubbers, e.g., butadiene/acrylonitrile, acrylonitrile/butadiene/styrene, methacrylate/acrylonitrile/butadiene/styrene copolymers, 2-chlorobutadiene-1,3 polymers, chlorinated rubber, and styrene/butadiene/styrene, styrene/isoprene/styrene block copolymers; copolyesters, e.g., those prepared from the reaction product of a polymethylene glycol of the formula $HO(CH_2)_nOH$, where n is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids; cellulose ethers, e.g., ethyl benzyl cellulose; poly N-vinyl carbazole and copolymers thereof; and carbazole containing polymers such as disclosed in *Journal of Polymer Science: Polymer Chemistry Edition*, Vol. 18, pages 9–18 (1979) by H. Kamogawa, et al.

Particularly preferred binders for use in the Binder Oriented System include polystyrene, poly(styrene/acrylonitrile), poly(styrene/methyl methacrylate), and polyvinyl benzal as well as admixtures thereof.

The same photoinitiator system activatable by actinic radiation may be used in either the Monomer Oriented System or the Binder Oriented System. Typically the photoinitiator system will contain a photoinitiator and a sensitizer which extends the spectral response into regions having special utility, e.g., the near U.V. region and the visible spectral regions where lasers emit.

Suitable free radical-generating addition polymerization initiators activatable by actinic light and thermally inactive at and below 185° C. include the substituted or unsubstituted polynuclear quinones which are compounds having two intracyclic carbon atoms in a conjugated carbocyclic ring system, e.g., 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz(a)anthracene-7,12-dione. Other photoinitiators which are also useful, even though some may be thermally active at temperatures as low as 85° C., are described in U.S. Pat. No. 2,760,863 and include vicinal ketaldonyl alcohols, such as benzoin, pivaloin, acyloin ethers, e.g., benzoin methyl and ethyl ethers; α-hydrocarbon-substituted aromatic acyloins, including α-methylbenzoin, α-allylbenzoin and α-phenylbenzoin. Photoreducible dyes and reducing agents, such as those disclosed in U.S. Pat. Nos. 2,850,445: 2,875,047; 3,097,096; 3,074,974; 3,097,097; 3,145,104 and 3,579,339; as well as dyes of the phenazine, oxazine, and quinone classes; Michler's ketone, benzophenone; 2,4,5-triphenylimidazolyl dimers with hydrogen donors, and mixtures thereof as described in U.S. Pat. Nos. 3,427,161; 3,479,185; 3,549,367; 4,311,783; 4,622,286; and 3,784,557 can be used as initiators. A useful discussion of dye sensitized photopolymerization can be found in "Dye Sensitized Photopolymerization" by D. F. Eaton in *Adv. in Photochemistry*, Vol. 13, D. H. Volman, G. S. Hammond, and K. Gollinick, eds., Wiley-Interscience, New York, 1986, pp. 427–487. Similarly the cyclohexadienone compounds of U.S. Pat. No. 4,341,860 are useful as initiators. Preferred photoinitiators include CDM-HABI, i.e., 2-(o-chlorophenyl)-4,5-bis(m-methoxyphenyl)imidazole dimer; o-Cl-HABI, i.e., 1,1'-biimidazole, 2,2'-bis(o-chlorophenyl)-4,4',5,5'-tetraphenyl-; and TCTM-HABI, i.e., 1H-imidazole, 2,5-bis(o-chlorophenyl)-4-3,4-dimethoxyphenyl-, dimer, each of which is typically used with a hydrogen donor, e.g., 2-mercaptobenzoxazole.

Sensitizers useful with photoinitiators include methylene blue and those disclosed in U.S. Pat. Nos. 3,554,753; 3,563,750; 3,563,751; 3,647,467; 3,652,275; 4,162,162; 4,268,667; 4,351,893; 4,454,218; 4,535,052; and 4,565,769 each of which is incorporated herein by reference. Particularly preferred sensitizers include the following:

DBC, i.e., Cyclopentanone, 2,5-bis{[4-(diethylamino)-2-methylphenyl]-methylene};
DEAW, i.e., Cyclopentanone, 2,5-bis{[4-(diethylamino)-phenyl]methylene}; and dimethoxy-JDI, i.e., 1H-inden-1-one, 2,3-dihydro-5,6-dimethoxy-2-[(2,3,6,7-tetra-hydro-1H,5H-benzo[i,j]quinolizin-9-yl)methylene]- which have the following structures respectively:

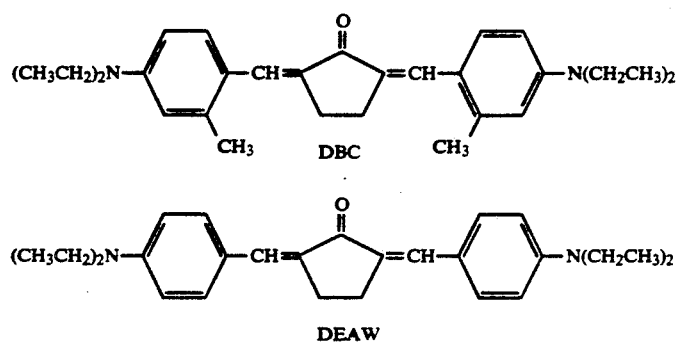

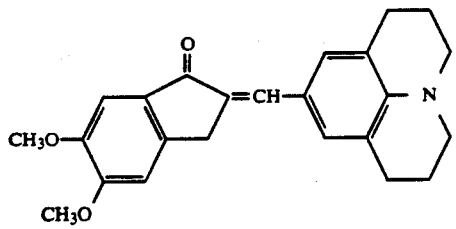

Dimethoxy-JDI

The solid, photopolymerizable compositions of this invention may contain a plasticizer to enhance the refractive index modulation of the imaged composition. Plasticizers typically may be used in amounts varying from about 2% to about 25% by weight of the composition, preferably 5 to about 15 wt. %. Suitable plasticizers include, triethylene glycol, triethylene glycol diacetate, triethylene glycol diproprionate, triethylene glycol dicaprylate, triethylene glycol dimethyl ether, triethylene glycol bis(2-ethyl-hexanoate), tetraethylene glycol diheptanoate, poly(ethylene glycol), poly(ethylene glycol) methyl ether, isopropylnaphthalene, diisopropylnaphthalene, poly(propylene glycol), glyceryl tributyrate, diethyl adipate, diethyl sebacate, dibutyl suberate, tributyl phosphate, tris(2-ethylhexyl) phosphate, Brij® 30 [$C_{12}H_{25}(OCH_2CH_2)_4OH$], and Brij® 35 [$C_{12}H_{25}(OCH_2CH_2)_{20}OH$]. Many of the plasticizers can be expressed by the following general formulae:

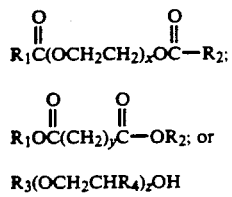

wherein each of $R_1$ and $R_2$ is alkyl group of 1 to 10 carbon atoms; $R_3$ is H or an alkyl group having 8 to 16 carbon atoms, $R_4$ is H or $CH_3$; x is 1 to 4; y is 2 to 10 and z is 1 to 20. Particularly preferred plasticizers for use in simple cellulose acetate butyrate systems are triethylene glycol dicaprylate, tetraethylene glycol diheptanoate, diethyl adipate, Brij® 30 and tris-(2-ethylhexyl)phosphate. Similarly, triethylene glycol dicaprylate, diethyl adipate, Brij® 30, and tris-(2-ethylhexyl)phosphate are preferred in "Monomer Oriented Systems" where cellulose acetate butyrate is the binder.

Other plasticizers that yield equivalent results will be apparent to those skilled in the art, and may be employed in accordance with the invention. It also will be appreciated that plasticizers may be substituted for some or all of the liquid monomer in the event that a solid monomer is present, provided that the mixture of plasticizer and monomer(s) remain liquid. Other conventional components that are used in photopolymer systems may be utilized with the compositions and elements of this invention if so desired. Such components include: optical brighteners, ultraviolet radiation absorbing material, thermal stabilizers, hydrogen donors, oxygen scavengers and release agents.

Optical brighteners useful in the process of the invention include those disclosed in Held U.S. Pat. No. 3,854,950, incorporated herein by reference. A preferred optical brightener is 7-(4'chloro-6'-diethylamino-1',3',5'-triazine-4'-yl)amino 3-phenyl coumarin. Ultraviolet radiation absorbing materials useful in the invention are also disclosed in Held U.S. Pat. No. 3,854,950.

Useful thermal stabilizers include: hydroquinone, phenidone, p-methoxyphenol, alkyl and aryl-substituted hydroquinones and quinones, tert-butyl catechol, pyrogallol, copper resinate, naphthylamines, beta-naphthol, cuprous chloride, 2,6-di-tert-butyl p-cresol, phenothiazine, pyridine, nitrobenzene, dinitrobenzene, p-toluquinone and chloranil. The dinitroso dimers described in Pazos U.S. Pat. No. 4,168,982, incorporated herein by reference, are also useful. Normally a thermal polymerization inhibitor will be present to increase stability in the storage of the photopolymerizable composition.

Hydrogen donor compounds useful as chain transfer agents in the photopolymer compositions include: 2-mercaptobenzoxazole, 2-mercaptobenzothiazole, etc.; as well as various types of compounds, e.g., (a) ethers, (b) esters, (c) alcohols, (d) compounds containing allylic or benzylic hydrogen cumene, (e) acetals, (f) aldehydes, and (g) amides as disclosed in column 12, lines 18 to 58 of MacLachlan U.S. Pat. No. 3,390,996, incorporated herein by reference.

Compounds which have been found useful as release agents are described in Bauer U.S. Pat. No. 4,326,010, incorporated herein by reference. A useful release agent is polycaprolactone.

Amounts of ingredients in the photopolymerizable compositions will generally be within the following percentage ranges based on total weight of the photopolymerizable layer: monomer, 5–60%, preferably 15–50%; initiator 0.1–10%, preferably 1–5%: binder, 25–75%, preferably 45–65%; plasticizer, 0–25%, preferably 5–15%; and other ingredients 0–5%.

The invention now will be further described by reference to the following examples.

GENERAL PROCEDURES

Sample Preparation

Coating solutions without visible sensitizer, DEAW unless otherwise indicated, were prepared under yellow or red light. After addition of visible sensitizer, all operations on solutions and the resulting coatings were performed under red light only. To further protect them from light, solutions were prepared and stored in amber bottles. Solutions were prepared by adding components to the solvent and then mixing with a mechanical stirrer until they completely dissolved. The solvent used was either dichloromethane; a mixture of dichloromethane (80-85 wt %), chloroform (10%), and methanol (5-10%); or dichloromethane (90-92%) and 2-butanone (8-10%). The components of all solutions were used as received from the manufacturer without purification, except for the monomer TDA which was chromatographed on aluminum oxide (activity-1) just prior to use.

Solutions were coated onto a clear film support of polyethylene terephthalate (Cronar® C72 or 400 D Mylar®) at a web speed of 8 fpm using a Talboy coater equipped with a doctor knife, 12 ft. drier set at 50°–70° C., and a laminator station. A cover sheet of 1-mil polypropylene was laminated to the coatings after drying. Coating samples were stored in black polyethylene bags at room temperature until used. Identification of the chemical components used in sample preparation is contained in the "glossary of chemical names" which follows.

SAMPLE EVALUATION

Sections of coated film were cut, the cover sheet removed, and then mounted onto 4×5 inch glass plates by hand laminating the tacky coating directly to the glass surface. The polyethylene terephthalate film support was left in place and served to protect the coating during handling and exposure operations.

Glass mounted coatings were evaluated by recording a series of holographic diffraction gratings and determining their efficiency. Gratings were obtained by actinic exposure at the intersection of two interfering collimated beams of an argon ion laser operating at 488 nm and $TEM_{oo}$. See the Figure. The beam intensity ratio was maintained at about 1:1, with absolute intensities ranging from 3–10 mW/cm$^2$ per beam. The diameter of each beam was about 1 cm. Exposure times ranged from about 1 sec to several minutes, depending on the system, corresponding to 12.5–2,000 mJ/cm$^2$ total exposure. About one minute after the image-wise exposure just described, each grating was given a 1–2 minute fixing exposure using one of the two 488 nm laser beams. Grating formation was measured in real time by passing a 632.8 nm He:Ne laser beam through the center of the exposure area at the Bragg angle. The intensity of the He:Ne laser beam was monitored with a Coherent model 212 power meter attached to a strip chart recorder. Gratings so produced have a spatial line frequency of about 1000 lines per mm; i.e., between 900 and 1100 lines per mm. Diffraction efficiency ($\eta$) was calculated as the ratio of the diffracted beam intensity ($I_{diff}$) to the pre-exposure undiffracted beam intensity ($I_o$) after passing through the coating:

$$\eta = I_{diff}/I_o$$

A series of exposure times was used so maximum $\eta$ could be determined. Coating thicknesses were measured for photocured samples using either a Sloan DEKTAK 3030 surface profile monitoring system or a Brown and Sharpe model 975 Electronic Comparator.

For each sample, the refractive index modulation in the recorded gratings was calculated from measured diffraction efficiencies and coating thicknesses using Kogelnik's coupled wave theory, previously described.

| Glossary of Chemical Names | |
|---|---|
| BHT | 2,6-Di-tert-butyl-4-methylphenol |
| CAB | Cellulose acetate butyrate |
| Carboset XL-27 | Poly(methyl methacrylate/ethylacrylate/acrylic acid) wt. av. MW 40,000, Acid No. 80, $T_g53°$ C. |
| Carboset 525 | Poly(methyl methacrylate/ethylacrylate/acrylic acid) wt. av. MW 200,000, Acid No. 80, $T_g37°$ C. |
| o-Cl-HABI | 1,1'-Biimidazole, 2,2'-bis[o-chlorophenyl]-4,4',5,5'-tetraphenyl-; CAS 1707-68-2 |
| CPA | p-Chlorophenyl acrylate |
| CP19-Y | 90:10 poly(methyl methacrylate-methacrylic acid) |
| DDA | 1,10-Decanediol diacrylate |
| DEAW | Cyclopentanone, 2,5-bis{[4-(diethylamino)-phenyl]methylene}; CAS 38394-53-5 |
| Dimethoxy-JDI | 1H-Inden-1-one, 2,3-dihydro-5,6-dimethoxy-2-[(2,3,6,7-tetrahydro-1H,5H-benzo [i,j] quinolizin-9-yl)methylene]-; CAS 80867-05-6 |
| Elvacite ® 2008 | 98:2 poly(methyl methacrylate-methacrylic acid); MW = 25,000 |
| Elvacite ® 2051 | poly(methyl methacrylate); MW = 350,000 |
| 1H,1H-PFOA | 1H,1H-Perfluorooctyl acrylate |
| 1H,1H,2H,2H-PFOMA | 1H,1H,2H,2H-Perfluorooctyl methacrylate |
| MHQ | 4-methoxyphenol |
| MBO | 2-Mercaptobenzoxazole; 2-Benzoxazolethiol; CAS 2382-96-9 |
| NVC | N-Vinyl carbazole; 9-Vinyl carbazole; CAS 1484-13-5 |
| PA | Phenyl acrylate; 2-Propenoic acid, phenyl ester; CAS 937-41-7 |
| POEA | 2-Phenoxyethyl acrylate; CAS 48145-04-6 |
| TCTM-HABI | 1H-Imidazole, 2,5-bis[o-chlorophenyl]-4-[3,4-dimethoxyphenyl]-, dimer; CAS 79070-04-5 |
| TDC | Triethylene glycol dicaprylate; CAS 106-10-5 |
| TDA | Triethylene glycol diacrylate: CAS 1680-21-3 |
| TMPEOTA | Triacrylate ester of ethoxylated trimethylolpropane; CAS 28961-43-5 |
| TMPTMA | Trimethylolpropane trimethacrylate; 2-ethyl-2-(hydroxymethyl)-1,3-propanediol trimethacrylate; CAS 3290-92-4. |

CONTROL EXAMPLES A–I

The following examples illustrate representative prior art compositions using cellulose acetate butyrate binder (Eastman CAB#531-1), a hexaarylbiimidazole/dye-sensitizer initiator system and various monomers.

Photopolymerizable compositions were prepared according to the general procedure as follows: 78 g dichloromethane, 12.5 g (50.4% of solids) CAB 531-1, 11.5 g (46.4%) of monomer, 0.45 g (1.89%) of MBO, 0.3 g (1.29%) o-Cl-HABI, 0.07–0.28% DEAW (depending on thickness) and 0.0025 g BHT dissolved in 1 mL of dichloromethane.

The compositions were evaluated according to the general procedure. Refractive index modulation and diffraction efficiency values measured for the resulting holographic diffraction gratings are shown in the table below.

| Control Example | Monomer | Refractive Index Modulation (X100) | Thickness (Microns) | DE (%) |
|---|---|---|---|---|
| A | Triethylene glycol diacrylate | 0.24 | 14 | 3.0 |
| B | Triethylene glycol diacrylate | 0.28 | 38.1 | 27 |
| C | Triethylene glycol diacrylate | 0.30 | 66.3 | 78 |

-continued

| Control Example | Monomer | Refractive Index Modulation (X100) | Thickness (Microns) | DE (%) |
|---|---|---|---|---|
| D | Triethylene glycol dimethacrylate | 0.27 | 49.5 | 39 |
| E | Diethylene glycol diacrylate | 0.30 | 49.5 | 48 |
| F | Decanediol diacrylate | 0.18 | 50.8 | 21 |
| G | Ethoxyethoxyethyl acrylate | 0.13 | 48.8 | 10 |
| H | Trimethylolpropane triacrylate | 0.24 | 53.3 | 37 |
| I | iso-Bornyl acrylate | 0.20 | 53.8 | 27 |

CONTROL EXAMPLES J-O

The following examples illustrate compositions where both the polymeric binder and the unsaturated monomer used therein contain one or more phenyl or phenoxy groups. Coating compositions were prepared and evaluated as for Control Examples A-I.

The compositions were evaluated according to the general procedure. Refractive index modulation and diffraction efficiency values measured for the resulting holographic diffraction gratings are shown in the table below.

| Control Example | Monomer | Modulation (X100) | Thickness | DE (%) |
|---|---|---|---|---|
| | | Poly(styrene) Binder | | |
| J | 2-Phenoxyethyl acrylate | 0.52 | 30.5 | 52 |
| | | 70:30 Poly(stryene-methylmethacrylate) | | |
| K | 2-Phenoxyethyl acrylate | 0.16 | 60.9 | 23 |
| L | 2-Phenylethyl acrylate | 0.28 | 20.3 | 8 |
| | | 75:25 Poly(styrene-acrylonitrile) | | |
| M | 2-Phenoxyethyl acrylate | 0.31 | 64.8 | 71.5 |
| N | 2-Phenylethyl methacrylate | 0.46 | 20.3 | 21 |
| O | 2-Phenylethyl methacrylate | 0.15 | 22.9 | 3 |

EXAMPLE 1

This example illustrates a useful composition using CAB binder, a hexaarylbiimidazole/dye sensitizer initiator system, and POEA monomer.

A photopolymerizable composition was prepared according to the general procedure given above as follows: 78 g dichloromethane, 12.5 g (50.4% of solids) CAB-531-1, 11.5 g (46.3%) POEA, 0.45 g (1.8%) MBO, 0.3 g (1.2%) TCTM-HABI, 0.070 g (0.3%) DEAW, and 0.0025 g (0.01%) of MHQ dissolved in 1 mL of dicholoromethane.

The composition was evaluated according to the general procedure described above. An 11.2 micron coating of this composition had a measured refractive index modulation 0.010. A 17.3 micron coating of the same composition had a measured refractive index modulation of 0.011.

EXAMPLE 2

A 23.1 micron coating of a composition similar to that of Example 1, except that it contained 0.040 g of DEAW instead of 0.070 g DEAW, had a measured refractive modulation of 0.010.

EXAMPLES 3-14

These examples illustrates other useful compositions using CAB binders, a hexaarylbiimidazole/dye sensitizer initiator system, and other photopolymerizable monomers.

The procedure of Example 1 was followed with a number of other photopolymerizable monomers in place of POEA and with other grades of CAB to illustrate their utility in the practice of this invention. The compositions in Examples 3 and 4 contained 0.070 g of DEAW; the compositions in Examples 5-11 contained 0.040 g of DEAW; and the compositions in Examples 12 and 13 contained 0.017 g of DEAW. The monomers and binders used, as well as the measured refractive index modulations, are set forth below.

It can be seen that greatly improved refractive index modulation was achieved in these examples compared to control examples A-I.

| Ex. | Monomer | Refractive Index Modulation (X100) | Thickness (Microns) | DE (%) |
|---|---|---|---|---|
| | CAB Type 531-1 | | | |
| 1 | POEA | 1.0 | 11.2 | 30 |
| | POEA | 1.1 | 17.3 | 70 |
| 2 | POEA | 1.0 | 23.1 | 84 |
| 3 | 2-Phenoxyethyl methacrylate | 0.77 | 13.5 | 24 |
| | 2-Phenoxyethyl methacrylate | 0.55 | 22.6 | 35 |
| 4 | 2-(p-Chlorophenoxy)ethyl acrylate | 1.0 | 12.7 | 36 |
| | 2-(p-Chlorophenoxy)ethyl acrylate | 1.1 | 23.1 | 90 |
| 5 | p-Chlorophenyl acrylate | 1.1 | 18.8 | 72 |
| 6 | 2-Phenylethyl acrylate | 0.55 | 18.8 | 25 |
| 7 | Phenyl acrylate (PA) | 0.96 | 11.7 | 29.5 |
| 8 | 80% POEA - 20% 2,4,6-tribromo PA | 1.3 | 19.3 | 90 |
| 9 | 80% POEA - 20% 2-naphthyl acrylate | 1.3 | 8.9 | 31 |
| | 80% POEA - 20% 2-naphthyl acrylate | 1.4 | 11.7 | 57 |
| | 80% POEA - 20% 2-naphthyl acrylate | 1.4 | 21.3 | 100 |
| 10 | 80% POEA - 20% pentachloro PA | 1.2 | 19.1 | 85 |
| 11 | 63% POEA - 37% NVC | 1.5 | 9.7 | 47 |
| | 63% POEA - 37% NVC | 1.5 | 10.9 | 53 |
| | CAB Type 531-1 | | | |
| 12 | 85% POEA - 15% NVC | 1.5 | 8.1 | 33 |
| | 85% POEA - 15% NVC | 1.5 | 10.2 | 49 |
| | CAB Type 551-0.2 | | | |
| 13 | POEA | 1.0 | 21.3 | 80 |
| | CAB Type 553-0.4 | | | |
| 14 | POEA | 0.58 | 24.4 | 43 |

EXAMPLES 15-19

These examples illustrate other useful compositions using poly(methyl methacrylate) and its copolymers as binders, a hexaarylbiimidazole/dye sensitizer initiator system, and POEA monomer.

The procedure of Example 1 was followed with the exception that the binders set forth in the following table were used. All the compositions in these examples contained 0.017 g of DEAW. The measured refractive index modulations are significantly higher than in control examples A-I.

| Ex. | BINDER | Refractive Index Modulation (X100) | Thickness (Microns) | DE (%) |
|---|---|---|---|---|
| 15 | Elvacite ® 2008 | 0.81 | 27.9 | 83 |
| 16 | CP-19Y | 1.0 | 20.1 | 74 |
| 17 | Elvacite ® 2051 | 1.0 | 24.1 | 84 |
| 18 | Carboset ® XL-27 | 0.57 | 28.0 | 53 |
| 19 | Carboset ® 525 | 0.89 | 29.2 | 94 |

EXAMPLES 20-22

These examples illustrate useful compositions wherein decanediol diacrylate (DDA) monomer and various binders containing phenyl groups are used. The refractive index modulation values are set forth in the following table and are significantly higher than in the corresponding control examples E and J-O.

EXAMPLE 20

The procedure of Example 1 was followed with the exception that poly(styrene), $M_n=116,000$, $M_w=306,000$, was used as the binder and DDA was used as photopolymerizable monomer. The composition contained 0.017 g of DEAW.

EXAMPLE 21

The procedure of Example 1 was followed with the exception that poly(styrene-methyl methacrylate) (70:30), $M_n=108,000$, $M_w=233,000$, was used as the binder. The photopolymerizable monomer was DDA. The composition contained 0.017 g of DEAW.

EXAMPLE 22

The procedure of Example 1 was followed with the exception that poly(styrene-acrylonitrile) (75:25) was used as the binder with DDA monomer. The composition contained 0.040 g of DEAW.

| Ex. | BINDER | Refractive Index Modulation (X100) | Thickness (Microns) | DE (%) |
|---|---|---|---|---|
| 20 | Poly(styrene) | 1.1 | 23.4 | 92 |
| 21 | 70:30 Poly(styrene-methylmethacrylate) | 0.90 | 27.9 | 92 |
| 22 | 75:25 Poly(stryrene-acrylonitrile) | 1.1 | 25.4 | 97 |

EXAMPLES 23-25

These examples illustrate other useful compositions wherein different monomers are used with a poly(styrene) binder.

The procedure of Example 1 was followed with the exception that poly(styrene), $M_n=116,000$, $M_w=306,000$, was used as the binder and various other photopolymerizable monomers were used. All the compositions in these examples contained 0.017 g of DEAW. The monomers used and the measured refractive index modulations are set forth in the following table. It can be seen that the results are superior to control examples, e.g., Example 25 vs. control Example I.

| Ex. | Monomer | Refractive Index Modulation (X100) | Thickness (Microns) | DE (%) |
|---|---|---|---|---|
| 23 | 80% DDA - 20% 1H,1H-PFOA | 0.94 | 20.8 | 70 |
| 24 | 80% DDA - 20 1H,1H,2H,2H-PFOMA | 0.98 | 26.2 | 93 |
| 25 | iso-Bornyl acrylate | 0.68 | 22.9 | 51 |

EXAMPLES 26-30

These examples illustrate other useful compositions wherein different monomers are used with 70:30 poly(styrene-methyl methacrylate) binder.

The procedure of Example 1 was followed with the exception that poly(styrene-methyl methacrylate) (70:30), $M_n=108,000$, $M_w=233,000$, was used as the binder and various other photopolymerizable monomers were used. The compositions in Examples 26-28 contained 0.040 g of DEAW: the compositions in Examples 29-30 contained 0.017 g of DEAW. The monomers used and the measured refractive index modulations are set forth in the following table. The results are superior to control Examples, particularly control Examples A, D, E, I, K and L.

| Ex. | Monomer | Refractive Index Modulation (X100) | Thickness (Microns) | DE (%) |
|---|---|---|---|---|
| 26 | Triethylene glycol diacrylate | 0.90 | 23.9 | 78.5 |
| 27 | Diethylene glycol diacrylate | 0.86 | 22.1 | 67.5 |
| 28 | Triethylene glycol dimethacrylate | 0.67 | 18.3 | 34 |
| 29 | iso-Bornyl acrylate | 0.65 | 27.9 | 64 |
| 30 | TMPEOTA | 0.52 | 21.1 | 28 |

EXAMPLES 31-36

These examples illustrate other useful compositions wherein different monomers are used with 75:25 poly(styrene-acrylonitrile) binder.

The procedure of Example 1 was followed with the exception that poly(styrene-acrylonitrile) (75:25) was used as the binder and various other photopolymerizable monomers were used. The compositions in Examples 31-32 contained 0.040 g of DEAW: the compositions in Examples 33-36 contained 0.017 g of DEAW. The monomers used and the measured refractive index modulations are set forth in the following table. The results are superior to control Examples, particularly control Examples A, D, E, I, M, N and O.

| Ex. | BINDER | Refractive Index Modulation (X100) | Thickness (Microns) | DE (%) |
|---|---|---|---|---|
| 31 | Triethylene glycol diacrylate | 1.1 | 19.3 | 75.5 |
| 32 | Diethylene glycol diacrylate | 0.93 | 24.6 | 84 |
| 33 | 80% DDA - 20% 1H,1H-PFOA | 1.2 | 20.8 | 90 |
| 34 | Triethylene glycol dimethacrylate | 0.62 | 24.4 | 48.5 |
| 35 | Ethoxyethoxyethyl acrylate | 1.3 | 20.3 | 93 |
| 36 | iso-Bornyl acrylate | 0.68 | 28.2 | 69 |

EXAMPLE 37

This example illustrates a useful composition using 70:30 poly(styrene-methyl methacrylate) binder, a hexaarylbiimidazole/dye sensitizer initiator system, and TDA monomer, wherein a different dye sensitizer is used.

The following were dissolved in 88 g of dichloromethane: 13.0 g (50.4%) 70:30 poly(styrene-methyl methacrylate), 11.5 g (44.5%) TDA, 0.45 g (1.7%) MBO, 0.8 g (3.1%) TCTM-HABI, 0.066 g (0.3%) dimethoxy-JDI, and 0.0025 (0.01%) MHQ dissolved in 1 mL of 95% dichloromethane—5% methanol. The composition was evaluated by the procedure described in Example 1. A refractive index modulation of 0.0054 was measured.

EXAMPLE 38

This example illustrates a useful composition wherein a sensitizing dye and an amine are used to initiate photopolymerization.

The following were dissolved in 88 g of 95% dichloromethane—5% methanol: 13.9 g (53.8%) 70:30 poly(styrene-methyl methacrylate), 11.5 g (44.5%) TDA, 0.35 g (1.36%) N-phenyl glycine, 0.066 of (0.3%) acridine orange, and 0.0025 (0.01%) MHQ dissolved in 1 mL of 95% dichloromethane—5% methanol.

The composition was evaluated by the procedure described in Example 1. A refractive index modulation of 0.0054 was measured.

EXAMPLES 39-40

These examples are useful compositions containing TDC plasticizer, POEA monomer, and CAB 531-1 binder.

Two formulations were prepared, each containing different amounts of TDC and POEA, as tabulated below, and each containing 2.67 g CAB 531-1 (44.8%), 0.24 g TCTM-HABI (4.0%), 0.12 g MBO (2.0%), 0.0030 g DEAW (0.05%), 0.0006 g MHQ (0.01%), 1.9 g 2-butanone, and 17.09 g dichloromethane. The formulations were coated and evaluated as in Example 1, except the doctor knife has a 4-mil gap and the drier was set as 40°-50° C. Results are presented in table below. The refractive index modulation is greater than for the corresponding Examples 1 and 2 which did not contain TDC plasticizer.

EXAMPLES 41-42

These examples are useful compositions containing TDC plasticizer, CPA monomer, and CAB 531-1 binder.

Two formulations were prepared, each containing different amounts of TDC and CPA, as tabulated below, and each containing 5.34 g CAB 531-1 (44.8%), 0.48 g TCTM-HABI (4.0%), 0.24 g MBO (2.0%), 0.0060 g DEAW (0.05%), 0.0012 g MHQ (0.01%), 3.8 g 2-butanone, and 34.18 g dichloromethane. The formulations were coated and evaluated as described in examples 39-40; results are presented in the table below. The refractive index modulation is greater than for the corresponding Example 5 which did not contain TDC plasticizer.

| Ex. | Monomer Grams (wt %) | Plasticizer Grams (wt %) | Thickness (Microns) | DE (%) | Refractive Index Modulation (X100) |
|---|---|---|---|---|---|
| 39 | POEA, 2.6 (44%) | TDC, 0.30 (5%) | 9.32 | 28% | 1.2 |
| 40 | POEA, 2.0 (34%) | TDC, 0.90 (15%) | 8.95 | 37% | 1.4 |
| 41 | CPA, 5.3 (44%) | TDC, 0.60 (5%) | 6.27 | 16% | 1.3 |
| 42 | CPA, 4.1 (34%) | TDC, 1.80 (15%) | 5.89 | 18% | 1.5 |

EXAMPLE 43

This example is a useful composition containing TDC plasticizer, POEA monomer, NVC monomer, and CAB 531-1 binder.

A formulation was prepared containing 8.06 g CAB 531-1 (44.8%), 5.58 g POEA (31%), 1.08 g NVC (6.0%), 2.70 g TDC (15%), 0.18 g TCTM-HABI (1.0%), 0.36 g MBO (2.0%), 0.040 g DEAW (0.22%), 0.0018 g BHT (0.01%), 4.56 g 2-butanone, and 52.4 g dichloromethane. The formulation was coated and evaluated as described in examples 39-40; results are as follows:

Coating Thickness: 8.96 microns
Diffraction Efficiency: 72%
Index Modulation X100: 2.2 (Greater than Examples 11-12).

EXAMPLES 44-48

These examples show the concentration effect of TCD plasticizer in compositions containing TDA monomer and CAB 531-1 binder.

Five formulations were prepared, each containing different amounts of TDC and TDA, as described below, and each containing 12.6 g CAB 531-1 (54.8%), 0.23 g TCTM-HABI (1.0%), 0.46 g MBO (2.0%), 0.0104 g DEAW (0.045%), 0.0023 g MHQ (0.01%), 3.85 g methanol, 7.7 g chloroform, and 65.45 g dichloromethane. The formulations were coated and evaluated as described in Example 1; results are presented in the following table.

| Ex. | TDC Grams (wt %) | TDA Grams (wt %) | Thickness (Microns) | DE (%) | Refractive Index Modulation (X100) |
|---|---|---|---|---|---|
| 44 | 0.00 (0.0%) | 9.66 (42%) | 47.8 | 25 | 0.22 |
| 45 | 2.30 (10%) | 7.36 (32%) | 54.0 | 51 | 0.29 |
| 46 | 3.45 (15%) | 6.21 (27%) | 52.1 | 97 | 0.52 |
| 47 | 4.60 (20%) | 5.06 (22%) | 53.8 | 66 | 0.35 |
| 48 | 5.75 (25%) | 3.91 (17%) | 53.2 | 54 | 0.30 |

EXAMPLES 49-51

These examples illustrate useful compositions containing TDC plasticizer, TDA monomer, and different CAB binders.

EXAMPLE 49

A formulation was prepared containing 131.52 g CAB 531-1 (54.9%), 64.8 g TDA (27%), 36 g TDC (15%), 2.4 g TCTM-HABI (1.0%), 4.8 g MBO (2.0%), 0.108 g DEAW (0.0451%), 0.024 g MHQ (0.01%, 76 g methanol, 76 g chloroform, and 608 g dichloromethane. The solution was coated and evaluated according to the procedure of Example 1; results are presented below.

EXAMPLE 50

A formulation was prepared containing 65.76 g CAB 500-5 (54.9%), 32.4 g TDA (27%), 18 g TDC (15%), 1.2 g TCTM-HABI (1.0%), 2.4 g MBO (2.0%), 0.054 g DEAW (0.045%), 0.012 g MHQ (0.01%), 38 g methanol, 38 g chloroform, and 304 g dichloromethane. The formulation was coated and evaluated as described in Example 1; results are presented below.

EXAMPLE 51

A formulation was prepared containing 65.76 g CAB 381-20 (56.6%), 31.4 g TDA (27%), 17.5 g TDC (15%), 1.2 g TCTM-HABI (1.0%), 2.3 g MBO (2.0%), 0.052 g DEAW (0.045%), 0.012 g MHQ (0.01%), 37.7 g methanol, 37.7 g chloroform, and 301 g dichloromethane. The formulation was coated and evaluated as described in Example 1; results are presented below:

| Ex. | Binder | Plasticizer | Thickness (Microns) | DE (%) | Refractive Index Modulation (X100) |
|---|---|---|---|---|---|
| 49 | CAB 531-1 | TDC (15%) | 51.0 | 94% | 0.51 |
| 50 | CAB 500-5 | TDC (15%) | 50.9 | 92% | 0.50 |
| 51 | CAB 381-20 | TDC (15%) | 50.0 | 90% | 0.49 |

The materials described herein, particularly in Examples 3-14, and the apparatus in the figure is also used to form holographic optical elements, commonly called HOE's.

For example, a holographic lens is formed exposing the glass-mounted sample (28) to two interfering laser beams (38), one which is collimated as in the figure and the other which is diverging. The diverging beam is formed by removing one of the collimating lens (40). The focal length of the holographic lens thus formed is equal to the distance from the spatial filter's (26) pin hole and the glass-mounted sample.

Once the holographic lens is formed in this manner, its focusing ability is demonstrated by rotating the holographic lens, i.e., the glass-mounted sample (28), 180 degrees about a vertical axis through its center and passing only the collimated laser beam (38) through it. The collimated laser beam is diffracted by the holographic lens so as to focus the beam to a point at a distance from the holographic lens which is equal to the len's focal length, as determined above.

Other holographic optical elements may similarly be prepared by replacing one of the collimating lens (40) with a suitable optical component, e.g., a converging lens or some other complex optical component. Such holographic optical elements may be inexpensively reproduced and replace polished and molded elements currently in use, e.g., Fresnell lenses, head light lenses, etc.

Having described the invention, we claim:

1. An element containing a refractive-index image formed by exposure to actinic radiation, said element comprising a substantially solid layer that contains said image and is formed by photopolymerizing a composition consisting essentially of, by weight:
   (a) 25 to 75% of a solvent soluble, thermoplastic polymeric binder;
   (b) 5 to 60% of a liquid ethylenically unsaturated monomer, said monomer having a boiling point above 100° C. and being capable of addition polymerization;
   (c) 0.1 to 10% of a photoinitiator system that activates polymerization of said unsaturated monomer upon exposure to actinic radiation;
wherein said unsaturated monomer is an acrylate or methacrylate that contains a substituent from the group consisting of (1) an aromatic compound selected from the group consisting of (i) unsubstituted phenyl, (ii) substituted phenyl, (iii) substituted or unsubstituted naphthyl and (iv) substituted or unsubstituted heterocyclic aromatic having up to three rings; (2) chlorine, (3) bromine, and mixtures thereof, and said thermoplastic binder component is substantially free of said substituents, the composition having a refractive index modulation of at least approximately 0.005 as determined with 632.8 nm radiation from a transmission grating having a spatial frequency of about 1000 lines per millimeter, which transmission grating is prepared holographically from a layer of said composition.

2. The element of claim 1 wherein a plasticizer is also present in said composition.

3. The element of claim 2 wherein the plasticizer is selected from the group consisting of tris(2-ethylhexyl)-phosphate, glyceryl tributyrate, and a compound having the general formula:

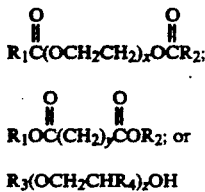

wherein $R_1$ and $R_2$ each is an alkyl group of 1 to 10 carbon atoms, $R_3$ is H or an alkyl group of 8 to 16 carbon atoms, $R_4$ is H or $CH_3$, x is 1–4, y is 2–20, and z is 1–20.

4. The element of claim 1 wherein the composition contains a solid ethylenically unsaturated monomer.

5. The element of claim 4 having a refractive index modulation of at least approximately 0.012.

6. The element of claim 4 wherein said solid monomer contains a carbazole group.

7. The element of claim 6 wherein said solid monomer is selected from the group consisting of N-vinyl carbazole; 3,6-dibromo-9-vinyl carbazole; and mixtures thereof.

8. The element of claim 4 wherein said solid monomer is selected from the group consisting of 2,4,6-tribromophenyl acrylate or methacrylate; pentachlorophenyl acrylate or methacrylate; 2-naphthyl acrylate or methacrylate; 2-(2-naphthyloxy)ethyl acrylate or methacrylate; the di-(2-acryloxyethyl)ether of tetrabromobisphenol A; and mixtures thereof.

9. The element of claim 1 wherein said unsaturated monomer is a phenoxyalkyl acrylate or methacrylate, a phenol ethoxylate acrylate or methacrylate, a phenyl alkyl acrylate or methacrylate, 2-(1-naphthyloxy)ethyl acrylate, the di(2-acryloxyethyl)ether of bisphenol-A, or ethoxylated bisphenol-A diacrylate.

10. The element of claim 1 or 9 wherein said polymeric binder is a cellulose acetate butyrate; an acrylate or methacrylate polymer or interpolymer; a vinyl butyral, acetal or formal polymer or interpolymer, or a vinyl acetate polymer or interpolymer.

11. The element of claim 1 containing a hologram.

12. The element of claim 11 wherein the hologram is a diffraction grating.

13. The element of claim 11 wherein the photopolymerized layer is approximately 10 to 60 μm thick.

14. The element of claim 11 wherein the hologram is a lens.

15. The element of claim 11 wherein the hologram is a holographic optical element.

* * * * *